(12) United States Patent
Kabakian et al.

(10) Patent No.: US 11,118,937 B2
(45) Date of Patent: Sep. 14, 2021

(54) ADAPTIVE DOWNHOLE INERTIAL MEASUREMENT UNIT CALIBRATION METHOD AND APPARATUS FOR AUTONOMOUS WELLBORE DRILLING

(71) Applicant: HRL Laboratories, LLC, Malibu, CA (US)

(72) Inventors: Adour V. Kabakian, Monterey Park, CA (US); Shuoqin Wang, Oak Park, CA (US); Logan D. Sorenson, Thousand Oaks, CA (US); Hung Nguyen, Los Angeles, CA (US); Raviv Perahia, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 437 days.

(21) Appl. No.: 15/897,907

(22) Filed: Feb. 15, 2018

(65) Prior Publication Data
US 2018/0252550 A1    Sep. 6, 2018

Related U.S. Application Data

(63) Continuation-in-part of application No. 15/823,489, filed on Nov. 27, 2017, now Pat. No. 10,718,198,
(Continued)

(51) Int. Cl.
*G01C 25/00* (2006.01)
*G01P 21/00* (2006.01)
(Continued)

(52) U.S. Cl.
CPC ........... *G01C 25/00* (2013.01); *G01C 25/005* (2013.01); *G01P 21/00* (2013.01);
(Continued)

(58) Field of Classification Search
CPC ..... G01C 25/00; G01P 21/00; G01R 33/0035; G01V 13/00; E21B 44/00; E21B 47/022; E21B 47/024
(Continued)

(56) References Cited

U.S. PATENT DOCUMENTS 4,205,379 A    5/1980    Fox et al.
4,454,756 A    6/1984    Sharp et al.
(Continued)

FOREIGN PATENT DOCUMENTS

EP    1 860 403 B1    8/2011
EP    2304496    10/2012
(Continued)

OTHER PUBLICATIONS

Frosio et al. in "Autocalibration of MEMS Accelerometers," IEEE Transactions on Instrumentation and Measurement, 58.6 (2009): pp. 2034-2041.
(Continued)

*Primary Examiner* — Michael P Nghiem
(74) *Attorney, Agent, or Firm* — Tope-McKay & Associates

(57) ABSTRACT

Described is a system for adaptive calibration of a sensor of an inertial measurement unit. Following each sensor measurement, the system performs automatic calibration of a multi-axis sensor. A reliability of a current calibration is assessed. If the current calibration is reliable, then bias and scale factor values are updated according to the most recent sensor measurement, resulting in updated bias and scale factor values. If the current calibration is not reliable, then previous bias and scale factor values are used. The system causes automatic calibration of the multi-axis sensor using either the updated or previous bias and scale factor values.

20 Claims, 14 Drawing Sheets

Related U.S. Application Data which is a continuation-in-part of application No. 15/387,435, filed on Dec. 21, 2016, now Pat. No. 10,514,261, and a continuation-in-part of application No. 15/279,390, filed on Sep. 28, 2016, now Pat. No. 10,246,988.

(60) Provisional application No. 62/477,327, filed on Mar. 27, 2017, provisional application No. 62/451,019, filed on Jan. 26, 2017, provisional application No. 62/427,561, filed on Nov. 29, 2016, provisional application No. 62/321,042, filed on Apr. 11, 2016, provisional application No. 62/233,936, filed on Sep. 28, 2015.

(51) Int. Cl.
*G01R 33/00* (2006.01)
*G01V 13/00* (2006.01)
*G01R 35/00* (2006.01)
*G01R 33/02* (2006.01)
*G01P 15/18* (2013.01)

(52) U.S. Cl.
CPC ......... *G01R 33/0035* (2013.01); *G01V 13/00* (2013.01); *G01P 15/18* (2013.01); *G01R 33/0206* (2013.01); *G01R 35/00* (2013.01)

(58) Field of Classification Search
USPC .................................................. 702/150, 104
See application file for complete search history.

(56) References Cited

U.S. PATENT DOCUMENTS

| | | | |
|---|---|---|---|
| 4,542,647 A | 9/1985 | Molnar | |
| 4,812,977 A | 3/1989 | Hulsing | |
| 5,420,592 A | 5/1995 | Johnson | |
| 5,432,699 A | 7/1995 | Hache et al. | |
| 6,205,851 B1 | 3/2001 | Jogi | |
| 6,257,356 B1 | 7/2001 | Wassell | |
| 6,267,185 B1 | 7/2001 | Mougel | |
| 6,308,787 B1 | 10/2001 | Alft | |
| 6,453,239 B1* | 9/2002 | Shirasaka | G01C 21/16 701/508 |
| 6,493,631 B1 | 12/2002 | Burns | |
| 6,633,816 B2 | 10/2003 | Shirasaka et al. | |
| 6,668,465 B2 | 12/2003 | Noureldin et al. | |
| 6,823,602 B2 | 11/2004 | Noureldin et al. | |
| 8,442,769 B2 | 5/2013 | Phillips et al. | |
| 9,804,288 B2 | 10/2017 | Estes | |
| 10,246,988 B2* | 4/2019 | Wang | E21B 7/04 |
| 10,444,014 B1* | 10/2019 | Sorenson | G01C 19/5755 |
| 10,514,261 B2* | 12/2019 | Sorenson | G01C 21/08 |
| 10,571,267 B1* | 2/2020 | Sorenson | G01C 19/5726 |
| 10,718,198 B2* | 7/2020 | Sorenson | E21B 41/00 |
| 2005/0022402 A1 | 2/2005 | Ash et al. | |
| 2005/0022404 A1 | 2/2005 | Ash et al. | |
| 2008/0000686 A1 | 1/2008 | Kuckes et al. | |
| 2009/0120690 A1 | 5/2009 | Phillips | |
| 2009/0222209 A1 | 9/2009 | Morys | |
| 2010/0045701 A1 | 2/2010 | Scott | |
| 2010/0211318 A1 | 8/2010 | Brooks | |
| 2011/0063458 A1* | 3/2011 | Washisu | H04N 5/23258 348/208.2 |
| 2013/0292176 A1 | 11/2013 | Ekseth et al. | |
| 2013/0311084 A1 | 11/2013 | Lundquist et al. | |
| 2013/0317741 A1* | 11/2013 | Brashear | G01C 21/165 701/472 |
| 2013/0341090 A1 | 12/2013 | Zeineddine et al. | |
| 2014/0163888 A1 | 6/2014 | Bowler | |
| 2014/0214387 A1 | 7/2014 | Tilke | |
| 2014/0372026 A1 | 12/2014 | Georgy et al. | |
| 2015/0027779 A1* | 1/2015 | Sugiura | G01C 25/005 175/45 |
| 2015/0168176 A1* | 6/2015 | Wu | G01R 35/005 702/150 |
| 2015/0240620 A1 | 8/2015 | Bang et al. | |
| 2015/0331138 A1* | 11/2015 | Estes | G01V 3/26 324/346 |
| 2015/0337647 A1 | 11/2015 | Kostov et al. | |
| 2016/0032709 A1 | 2/2016 | Ledroz | |
| 2016/0123765 A1 | 5/2016 | Wu et al. | |
| 2016/0201449 A1 | 7/2016 | Dirksen | |
| 2016/0201455 A1 | 7/2016 | Liu et al. | |
| 2016/0231138 A1 | 8/2016 | Roberts-Thomson | |
| 2016/0245070 A1 | 8/2016 | VanSteenwyk | |
| 2016/0281489 A1 | 9/2016 | Dykstra et al. | |
| 2016/0282513 A1 | 9/2016 | Holmes | |
| 2017/0292840 A1* | 10/2017 | Sorenson | G01C 21/08 |
| 2017/0314384 A1* | 11/2017 | Wang | E21B 47/022 |
| 2018/0080310 A1* | 3/2018 | Sorenson | E21B 47/04 |
| 2019/0169979 A1* | 6/2019 | Nguyen | G01P 15/14 |

FOREIGN PATENT DOCUMENTS

| | | |
|---|---|---|
| WO | WO2012173601 A1 | 12/2012 |
| WO | WO 2013-082127 | 6/2013 |
| WO | WO2015/013523 A1 | 1/2015 |
| WO | WO 2015-119766 | 8/2015 |
| WO | WO2015119766 A1 | 8/2015 |
| WO | WO2016108901 A1 | 7/2016 |

OTHER PUBLICATIONS

C. T. Kelley, Iterative Methods for Optimization, SIAM Frontiers in Applied Mathematics, No. 18, 1999, section 3.1 (Chapter 3), pp. 39-40. ISBN 0-89871-433-8.

Belsley, David A.; Kuh, Edwin; Welsch, Roy E. (1980). "The Condition Number". Regression Diagnostics: Identifying Influential Data and Sources of Collinearity. New York: John Wiley & Sons. pp. 100-104. ISBN 0-471-05856-4.

Notification of Transmittal of International Search Report and the Written Opinion of the International Searching Authority for PCT/US2018/018402; dated Jun. 1, 2018.

International Search Report of the International Searching Authority for PCT/US2018/018402; dated Jun. 1, 2018.

Written Opinion of the International Searching Authority for PCT/US2018/018402; dated Jun. 1, 2018.

Notification of Transmittal of International Search Report and the Written Opinion of the International Searching Authority for PCT/US2016/054256; dated Jan. 11, 2017.

International Search Report of the International Searching Authority for PCT/US2016/054256; dated Jan. 11, 2017.

Written Opinion of the International Searching Authority for PCT/US2016/054256; dated Jan. 11, 2017.

Notification Concerning Transmittal of Copy of International Preliminary Report on Patentability for PCT/US2016/054256; dated Nov. 2, 2017.

International Preliminary Report on Patentability for PCT/US2016/054256; dated Nov. 2, 2017.

Professor Angus Jamieson, et al., "Introduction to wellbore positioning," University of the Highlands and Islands, 2012, Version: V05.08.16, pp. 1-197.

D. Obradovic et al., "Fusion of sensor data in Siemens car navigatin system", IEEE Tran.Vehicular Tech., vol. 56, pp. 43-50, (2007).

Jacques Georgy, et al., " Low cost three dimensional navigation solution for RISS/GPS integration using mixture particle filter", IEEE Tran. Vehicular Tech., vol. 59, pp. 599-615, (2010).

"Introduction to wellbore positioning", University of the Highlands & Islands (2012). Survey Calculation Methods, Sect.7, pp. 48-52.

Paul D. Groves, "Principles of GNSS, Inertial and Multisensor Integrated Navigation Systems," Artech House (2001). Ch.5, Inertial navigation system.

Introduction to Wellbore Positioning by Angus Jamieson/UHI Scotland, (2012), p. 188.

BP-Amoco, Directional Survey Handbook, (1999), section 5.1.
BP-Amoco, Directional Survey Handbook, (1999), section 5.4.
BP-Amoco, Directional Survey Handbook, (1999), section 5.6.

(56) References Cited

OTHER PUBLICATIONS

International Search Report and Written Opinion for Application No. PCT/US2016/068148, dated Apr. 12, 2017 (18 pages).
Chulliat, Arnaud et al., "The US/UK World Magnetic Model for 2015-2020: Technical Report", National Geophysical Data Center, NOAA, 2015, 112 pages.
Frosio, I URI et al., "Autocalibration of MEMS Accelerometers", IEEE Transactions on Instrumentation and Measurement, Jun. 2009, pp. 2034-2041, vol. 58, No. 6.
Prikhodko, Igor P., "What is MEMS Gyrocompassing? Comparative Analysis of Maytagging and Carouseling", Journal of Microelectromechanical Systems, Dec. 2013, pp. 1257-1266, vol. 22, No. 6.
"U.S./U.K. World Magnetic Model—Epoch 2015.0 Geomagnetic Longitude and Latitude", Dec. 2014, NOAA/NGDC & CIRES, 1 page.
International Preliminary Report on Patentability dated May 1, 2018 for PCT Application No. PCT/US2016/068148 (7 pages).
Notification of International Preliminary Report on Patentability Chapter I for PCT/US2018/018402; dated Oct. 10, 2019.
International Preliminary Report on Patentability Chapter I for PCT/US2018/018402; dated Oct. 10, 2019.
Office Action 1 for U.S. Appl. No. 15/387,435, dated Oct. 5, 2018.
Response to Office Action 1 for U.S. Appl. No. 15/387,435, dated Jan. 7, 2019.
Office Action 2 for U.S. Appl. No. 15/387,435, dated Apr. 8, 2019.
Response to Office Action 2 for U.S. Appl. No. 15/387,435, dated May 14, 2019.
Advisory Action for U.S. Appl. No. 15/387,435, dated Jun. 21, 2019.
RCE for U.S. Appl. No. 15/387,435, Date mailed: Jun. 26, 2019.
Notice of Allowance for U.S. Appl. No. 15/387,435, dated Aug. 6, 2019.
Notification of Transmittal of International Search Report and the Written Opinion of the International Searching Authority for PCT/US2017/063544; dated Mar. 16, 2018.
International Search Report of the International Searching Authority for PCT/US2017/063544; dated Mar. 16, 2018.
Written Opinion of the International Searching Authority for PCT/US2017/063544; dated Mar. 16, 2018.
International Preliminary Report on Patentability for PCT/U92017/063544; dated Jan. 4, 2019.
Office Action 1 for U.S. Appl. No. 15/279,390, dated Apr. 6, 2018.
Response to Office Action 1 for U.S. Appl. No. 15/279,390, dated Jul. 5, 2018.
Office Action 2 for U.S. Appl. No. 15/279,390, dated Sep. 6, 2018.
Response to Office Action 2 for U.S. Appl. No. 15/279,390, dated Nov. 6, 2018.
Notice of Allowance for U.S. Appl. No. 15/279,390, dated Nov. 15, 2018.
Office Action 1 for U.S. Appl. No. 15/825,067, dated Dec. 20, 2018.
Response to Office Action 1 for U.S. Appl. No. 15/825,067, dated Mar. 18, 2019.
Notice of Allowance for U.S. Appl. No. 15/825,067, dated May 2, 2019.
Notification of Transmittal of International Search Report and the Written Opinion of the International Searching Authority for PCT/US2017/063336; dated Mar. 5, 2018.
International Search Report of the International Searching Authority for PCT/US2017/063336; dated Mar. 5, 2018.
Written Opinion of the International Searching Authority for PCT/US2017/063336; dated Mar. 5, 2018.
International Preliminary Report on Patentability for PCT/US2017/063336; dated Jan. 11, 2019.
Office Action 1 for U.S. Appl. No. 15/823,489, dated Oct. 18, 2019.
Response to Office Action 1 for U.S. Appl. No. 15/823,489, dated Dec. 9, 2019.
Notice of Allowance for U.S. Appl. No. 15/823,489, dated Mar. 24, 2020.
Professor Angus Jamieson, et al., "Introduction to wellbore positioning," University of the Highlands and Islands, Scotland, 2012, Version: V05.08.16, pp. 1-197.
Communication pursuant to Rules 70(2) and 70a(2) EPC (the supplementary European search report) for the European Regional Phase Patent Application No. 16852524.4, dated May 28, 2019.
Response to the communication pursuant to Rules 70(2) and 70a(2) EPC (the supplementary European search report) for the European Regional Phase Patent Application No. 16852524.4, dated Apr. 6, 2020.
P. Cheung, et al, "SPWLA 48th Annual Logging Symposium, Jun. 3—In Situ Correction of Wireline Triaxial Accelerometer and Magnetometer Measurements," Jun. 3, 2007 (Jun. 3, 2007), XP055582218, Retrieved from the Internet: URL:www.onepetro.org [retrieved on Apr. 18, 2019].
Skog Isaac, et al, "A low-cost GPS aided inertial navigation system for vehicle applications," 2005 13th European Signal Processing Conference, IEEE, Sep. 4, 2005 (Sep. 4, 2005), pp. 1-4, XP032759870, ISBN: 978-1-60423-821-1, [retrieved on Apr. 1, 2015].
Communication pursuant to Rules 70(2) and 70a(2) EPC (the supplementary European search report) for the European Regional Phase Patent Application No. 17875911.4, dated Jul. 7, 2020.
Office Action 1 for the Chinese Patent Application No. 201680042937.2, dated Feb. 2, 2021.
English translation of Office Action 1 for the Chinese Patent Application No. 201680042937.2, dated Feb. 2, 2021.
A Compendium of Directional Calculations Based on the Minimum Curvature Method, S. J. Sawaryn etc., Society of Petroleum Engineers, pp. 24-36.
Communication pursuant to Rules 70(2) and 70a(2) EPC and the extended European Search Report for the European Regional Phase Patent Application No. 18775895.8, dated Dec. 21, 2020.
Response to the communication pursuant to Rules 70(2) and 70a(2) EPC (the supplementary European search report) for the European Regional Phase Patent Application No. 17875911.4, dated Jan. 14, 2021.

* cited by examiner

ADAPTIVE DOWNHOLE INERTIAL MEASUREMENT UNIT CALIBRATION METHOD AND APPARATUS FOR AUTONOMOUS WELLBORE DRILLING

CROSS-REFERENCE TO RELATED APPLICATIONS

The present application is a Continuation-in-Part application of U.S. application Ser. No. 15/823,489, now U.S. Pat. No. 10,718,198, filed in the United States on Nov. 27, 2017, entitled, "Opportunistic Sensor Fusion Algorithm for Autonomous Guidance While Drilling," which is a Non-Provisional patent application of U.S. Provisional Application No. 62/451,019, filed in the United States on Jan. 26, 2017, entitled, "Opportunistic Sensor Fusion Algorithm for Autonomous Guidance While Drilling." U.S. application Ser. No. 15/823,489 is also a Continuation-in-Part patent application of U.S. application Ser. No. 15/387,435, filed in the United States on Dec. 21, 2016, issued as U.S. Pat. No. 10,514,261, entitled, "Gyromagnetic Geopositioning System," which is a Non-Provisional patent application of U.S. Provisional Application No. 62/321,042, filed in the United States on Apr. 11, 2016, entitled, "Stabilization of Coriolis Vibratory Gyroscopes by Frequency Locking to Ultra Stable Clocks," the entirety of which are hereby incorporated by reference. U.S. application Ser. No. 15/823,489 is also a Continuation-in-Part patent application of U.S. application Ser. No. 15/279,390, filed in the United States on Sep. 28, 2016, issued as U.S. Pat. No. 10,246,988, entitled, "Real-Time Trajectory Estimation with Multi-Station Analysis," which is a Non-Provisional patent application of U.S. Provisional Application No. 62/233,936, filed in the United States on Sep. 28, 2015, entitled, "Real Time Trajectory Estimation with Multi-Station Analysis," the entirety of which are hereby incorporated by reference. U.S. application Ser. No. 15/823,489 is also a Non-Provisional patent application of U.S. Provisional Application No. 62/427,561, filed in the United States on Nov. 29, 2016, entitled, "Incremental Trajectory Estimation Based on Real Time Inertial Sensing," the entirety of which is hereby incorporated by reference.

The present application is ALSO a Non-Provisional patent application of U.S. Provisional Application No. 62/477,327, filed in the United States on Mar. 27, 2017, entitled, "Adaptive Downhole Inertial Measurement Unit Calibration Method and Apparatus for Autonomous Wellbore Drilling," the entirety of which is hereby incorporated by reference.

BACKGROUND OF INVENTION

(1) Field of Invention

The present invention relates to a system for automatic and adaptive calibration for sensors used in wellbore drilling systems and, more particularly, to a system for automatic and adaptive calibration for sensors used in the guidance and navigation of bottom hole assemblies (BHAs) employed in wellbore drilling systems.

(2) Description of Related Art

Recently, drilling of complicated well trajectories for boreholes has increased. A borehole is a narrow shaft bored in the ground, vertically and/or horizontally, which is constructed for a variety of purposes. There is typically a vertical section from surface, then a curve transition section from vertical to horizontal, and then a horizontal section in the oil and gas reserve. A borehole may be drilled for extraction of water, other liquids (e.g., petroleum) or gases (e.g., natural gas), or as part of a geotechnical investigation, environmental site assessment, mineral exploration, or temperature measurement.

Bottom Hole Assemblies (BHAs) used for directional drilling in the oil industry are fitted with various Inertial Measurement Units (IMUs). The IMUs are sensor packages. The sensors provide the necessary measurements to estimate wellbore trajectories. However, all such sensors exhibit bias and scale factor errors which must be compensated for if trajectory estimates are to be accurate. To this end, the sensors are calibrated before deployment, meaning their bias and scale factors are estimated by various measurement procedures in a laboratory. Due to the harsh drilling environment, sensor characteristics tend to drift unpredictably. As a result, the pre-deployment laboratory calibration becomes increasingly less representative of the state of the sensors, leading to less effective error correction. This results in increased errors for trajectory estimates.

The Multi-Station Analysis (MSA) method provides estimates of the average deviation of each calibration parameter from laboratory calibration throughout an entire operational run. MSA applies a single correction to all of the measurements obtained. Thus, a continuing need exists for a system that applies the best possible individualized correction to each measurement, leading to a more accurate set of measurements and, therefore, more accurate trajectory estimates.

SUMMARY OF INVENTION

The present invention relates to a system for automatic and adaptive calibration for sensors used in wellbore drilling systems and, more particularly, to a system for automatic and adaptive calibration for sensors used in the guidance and navigation of bottom hole assemblies (BHAs) employed in wellbore drilling systems. The system comprises one or more processors and a non-transitory computer-readable medium having executable instructions encoded thereon such that when executed, the one or more processors perform multiple operations. The system obtains a previous measurements from at least one multi-axis sensor having associated bias and scale factor values, wherein the previous measurements comprises measurement errors. The system performs an adaptive calibration of the at least one multi-axis sensor. The system determines a reliability of a current calibration of the at least one multi-axis sensor based on an optimization algorithm, wherein the optimization algorithm is used to minimize the measurement errors and obtain bias and scale factor values which best compensate for the measurement errors. When the current calibration is determined to be reliable based on convergence of the optimization algorithm, then the bias and scale factor values are updated according to an output of the optimization algorithm, resulting in updated bias and scale factor values. The at least one multi-axis sensor is calibrated using the updated bias and scale factor values.

In another aspect, the system uses the automatic calibration for guidance and navigation of a bottom hole assembly (BHA) employed in a wellbore drilling system.

In another aspect, the errors comprise bias, scale factor, and non-orthogonality errors.

In another aspect, during automatic calibration, the system replaces an oldest sensor measurement in a calibration window with a most recent sensor measurement, and the multi-axis sensor is calibrated using a most recent calibration window.

In another aspect, the system determines a bias vector and a scale factor matrix such that a cumulative error representing a deviation from reference values over all sensor measurements is minimized.

In another aspect, if the current calibration is not reliable, then the system expands a calibration window to include older sensor measurements and re-calibrates the multi-axis sensor until the current calibration is reliable or it is determined that the older sensor measurements are not representative of a current state of the multi-axis sensor, so previous bias and scale factor values are used.

In another aspect, each sensor measurement is weighted such that the most recent sensor measurement has the greatest effect on calibration, and wherein older sensor measurements are assigned lower weights the older they are.

In another aspect, polynomial expansions are used to represent drifts of the bias and scale factor values.

In another aspect, sensor measurements are used to compute estimates of a wellbore path.

The invention further comprises a system for automatic and adaptive calibration for sensors used in a vehicle. The system comprises one or more processors and a non-transitory computer-readable medium having executable instructions encoded thereon such that when executed, the one or more processors perform multiple operations. Following each sensor measurement, the system performs automatic calibration of a multi-axis sensor. A reliability of a current calibration is assessed. If the current calibration is reliable, then the system updates bias and scale factor values according to the most recent sensor measurement, resulting in updated bias and scale factor values. If the current calibration is not reliable, then the system uses previous bias and scale factor values. The system then causes automatic calibration of the multi-axis sensor using either the updated or previous bias and scale factor values. The automatic calibration is used for a vehicle.

Finally, the present invention also includes a computer program product and a computer implemented method. The computer program product includes computer-readable instructions stored on a non-transitory computer-readable medium that are executable by a computer having one or more processors, such that upon execution of the instructions, the one or more processors perform the operations listed herein. Alternatively, the computer implemented method includes an act of causing a computer to execute such instructions and perform the resulting operations.

BRIEF DESCRIPTION OF THE DRAWINGS

The objects, features and advantages of the present invention will be apparent from the following detailed descriptions of the various aspects of the invention in conjunction with reference to the following drawings, where.

DETAILED DESCRIPTION

Figure 1:
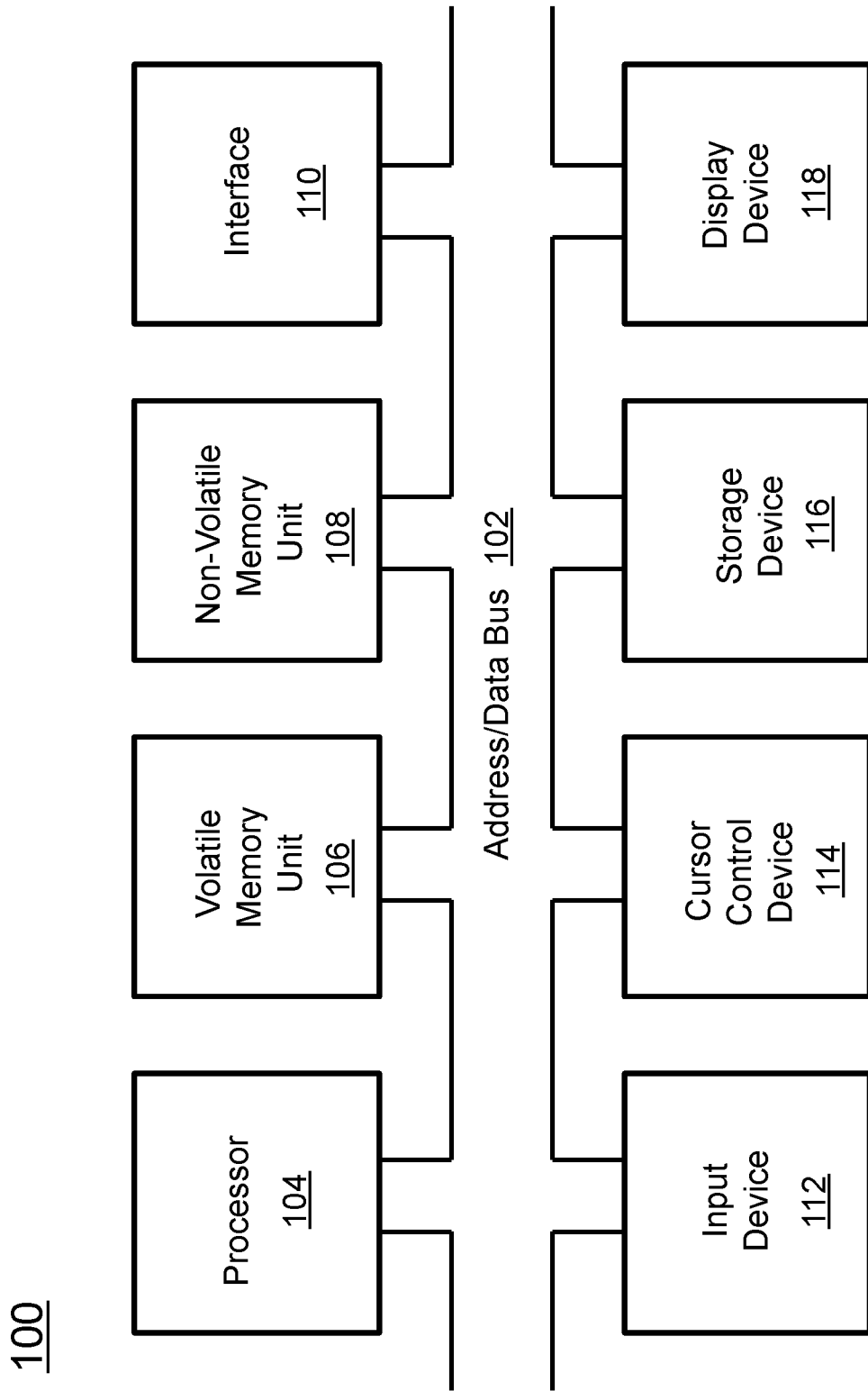
FIG. 1 is a block diagram depicting the components of a system for automatic and adaptive calibration for sensors used in wellbore drilling systems according to some embodiments of the present disclosure.

The present invention relates to a system for automatic and adaptive calibration for sensors used in wellbore drilling systems and, more particularly, to a system for automatic and adaptive calibration for sensors used in the guidance and navigation of bottom hole assemblies (BHAs) employed in wellbore drilling systems. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of aspects. Thus, the present invention is not intended to be limited to the aspects presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

(1) Principal Aspects

Various embodiments of the invention include three "principal" aspects. The first is a system for automatic and adaptive calibration for sensors used in wellbore drilling systems. The system is typically in the form of a computer system operating software or in the form of a "hard-coded" instruction set. This system may be incorporated into a wide variety of devices that provide different functionalities. The second principal aspect is a method, typically in the form of software, operated using a data processing system (computer). The third principal aspect is a computer program product. The computer program product generally represents computer-readable instructions stored on a non-transitory computer-readable medium such as an optical storage device, e.g., a compact disc (CD) or digital versatile disc (DVD), or a magnetic storage device such as a floppy disk or magnetic tape. Other, non-limiting examples of computer-readable media include hard disks, read-only memory (ROM), and flash-type memories. These aspects will be described in more detail below.

A block diagram depicting an example of a system (i.e., computer system 100) of the present invention is provided in FIG. 1. The computer system 100 is configured to perform calculations, processes, operations, and/or functions associated with a program or algorithm. In one aspect, certain processes and steps discussed herein are realized as a series of instructions (e.g., software program) that reside within computer readable memory units and are executed by one or more processors of the computer system 100. When executed, the instructions cause the computer system 100 to perform specific actions and exhibit specific behavior, such as described herein.

The computer system 100 may include an address/data bus 102 that is configured to communicate information. Additionally, one or more data processing units, such as a processor 104 (or processors), are coupled with the address/data bus 102. The processor 104 is configured to process information and instructions. In an aspect, the processor 104 is a microprocessor. Alternatively, the processor 104 may be a different type of processor such as a parallel processor, application-specific integrated circuit (ASIC), programmable logic array (PLA), complex programmable logic device (CPLD), or a field programmable gate array (FPGA).

The computer system 100 is configured to utilize one or more data storage units. The computer system 100 may include a volatile memory unit 106 (e.g., random access memory ("RAM"), static RAM, dynamic RAM, etc.) coupled with the address/data bus 102, wherein a volatile memory unit 106 is configured to store information and instructions for the processor 104. The computer system 100 further may include a non-volatile memory unit 108 (e.g., read-only memory ("ROM"), programmable ROM ("PROM"), erasable programmable ROM ("EPROM"), electrically erasable programmable ROM "EEPROM"), flash memory, etc.) coupled with the address/data bus 102, wherein the non-volatile memory unit 108 is configured to store static information and instructions for the processor 104. Alternatively, the computer system 100 may execute instructions retrieved from an online data storage unit such as in "Cloud" computing. In an aspect, the computer system 100 also may include one or more interfaces, such as an interface 110, coupled with the address/data bus 102. The one or more interfaces are configured to enable the computer system 100 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In one aspect, the computer system 100 may include an input device 112 coupled with the address/data bus 102, wherein the input device 112 is configured to communicate information and command selections to the processor 100. In accordance with one aspect, the input device 112 is an alphanumeric input device, such as a keyboard, that may include alphanumeric and/or function keys. Alternatively, the input device 112 may be an input device other than an alphanumeric input device. In an aspect, the computer system 100 may include a cursor control device 114 coupled with the address/data bus 102, wherein the cursor control device 114 is configured to communicate user input information and/or command selections to the processor 100. In an aspect, the cursor control device 114 is implemented using a device such as a mouse, a track-ball, a track-pad, an optical tracking device, or a touch screen. The foregoing notwithstanding, in an aspect, the cursor control device 114 is directed and/or activated via input from the input device 112, such as in response to the use of special keys and key sequence commands associated with the input device 112. In an alternative aspect, the cursor control device 114 is configured to be directed or guided by voice commands.

In an aspect, the computer system 100 further may include one or more optional computer usable data storage devices, such as a storage device 116, coupled with the address/data bus 102. The storage device 116 is configured to store information and/or computer executable instructions. In one aspect, the storage device 116 is a storage device such as a magnetic or optical disk drive (e.g., hard disk drive ("HDD"), floppy diskette, compact disk read only memory ("CD-ROM"), digital versatile disk ("DVD")). Pursuant to one aspect, a display device 118 is coupled with the address/data bus 102, wherein the display device 118 is configured to display video and/or graphics. In an aspect, the display device 118 may include a cathode ray tube ("CRT"), liquid crystal display ("LCD"), field emission display ("FED"), plasma display, or any other display device suitable for displaying video and/or graphic images and alphanumeric characters recognizable to a user.

The computer system 100 presented herein is an example computing environment in accordance with an aspect. However, the non-limiting example of the computer system 100 is not strictly limited to being a computer system. For example, an aspect provides that the computer system 100 represents a type of data processing analysis that may be used in accordance with various aspects described herein. Moreover, other computing systems may also be implemented. Indeed, the spirit and scope of the present technology is not limited to any single data processing environment. Thus, in an aspect, one or more operations of various aspects of the present technology are controlled or implemented using computer-executable instructions, such as program modules, being executed by a computer. In one implementation, such program modules include routines, programs, objects, components and/or data structures that are configured to perform particular tasks or implement particular abstract data types. In addition, an aspect provides that one or more aspects of the present technology are implemented by utilizing one or more distributed computing environments, such as where tasks are performed by remote processing devices that are linked through a communications network, or such as where various program modules are located in both local and remote computer-storage media including memory-storage devices.

Figure 2:
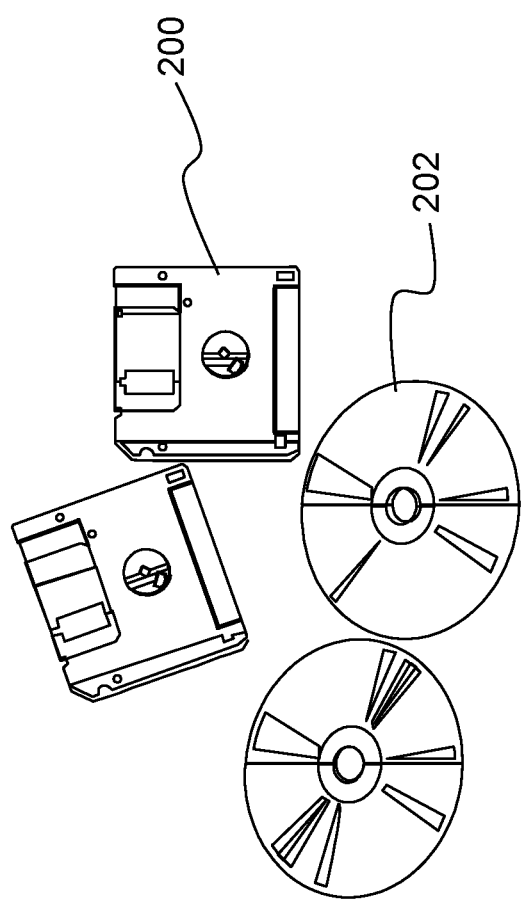
FIG. 2 is an illustration of a computer program product according to some embodiments of the present disclosure.

An illustrative diagram of a computer program product (i.e., storage device) embodying the present invention is depicted in FIG. 2. The computer program product is depicted as floppy disk 200 or an optical disk 202 such as a CD or DVD. However, as mentioned previously, the computer program product generally represents computer-readable instructions stored on any compatible non-transitory computer-readable medium. The term "instructions" as used with respect to this invention generally indicates a set of operations to be performed on a computer, and may represent pieces of a whole program or individual, separable, software modules. Non-limiting examples of "instruction" include computer program code (source or object code) and "hard-coded" electronics (i.e. computer operations coded into a computer chip). The "instruction" is stored on any non-transitory computer-readable medium, such as in the memory of a computer or on a floppy disk, a CD-ROM, and a flash drive. In either event, the instructions are encoded on a non-transitory computer-readable medium.

(2) Specific Details of Various Embodiments

Described is a system which provides automatic and adaptive calibration for sensor packages used in the guidance and navigation of Bottom Hole Assemblies (BHAs) employed in wellbore drilling systems. BHAs used for directional drilling in the oil industry are fitted with various Inertial Measurement Units (IMUs). The IMUs are sensor packages comprising all or some of the following types of sensors: accelerometers, magnetometers, and gyroscopes. These sensors provide the necessary measurements to estimate wellbore trajectories. However, all such sensors exhibit bias and scale factor errors which must be compensated for if trajectory estimates are to be accurate. To this end, the sensors are calibrated before deployment, meaning their bias and scale factors are estimated by various measurement procedures in a laboratory. Due to the harsh drilling environment, sensor characteristics tend to drift unpredictably. As a result, the pre-deployment laboratory calibration becomes increasingly less representative of the state of the sensors, leading to less effective error correction. This results in increased errors for trajectory estimates.

The invention disclosed herein is a downhole automatic calibration algorithm embedded in the BHA apparatus, which uses a few of the most recent measurements to update the calibration of all sensors after each measurement. Therefore, the system tracks the drifts in biases and scale factors to maintain sensor accuracy and improve borehole trajectory estimate accuracy. The downhole calibration algorithm works by ensuring that these measurements are consistent with known reference quantities, such as gravity, the Earth's rotation rate, and the Earth's magnetic field. This calibration mechanism does not require human intervention and is, therefore, ideally suited for maintaining the accuracy of the guidance and navigation unit of autonomous drilling systems.

During wellbore drilling, all operations are periodically suspended, such as during pipe connections, providing a quiet and low noise environment in which to make accurate measurements of gravity, the Earth's rotation rate, and the Earth's magnetic field. These measurements, called "surveys", are used to compute estimates of the wellbore path.

Figure 3:
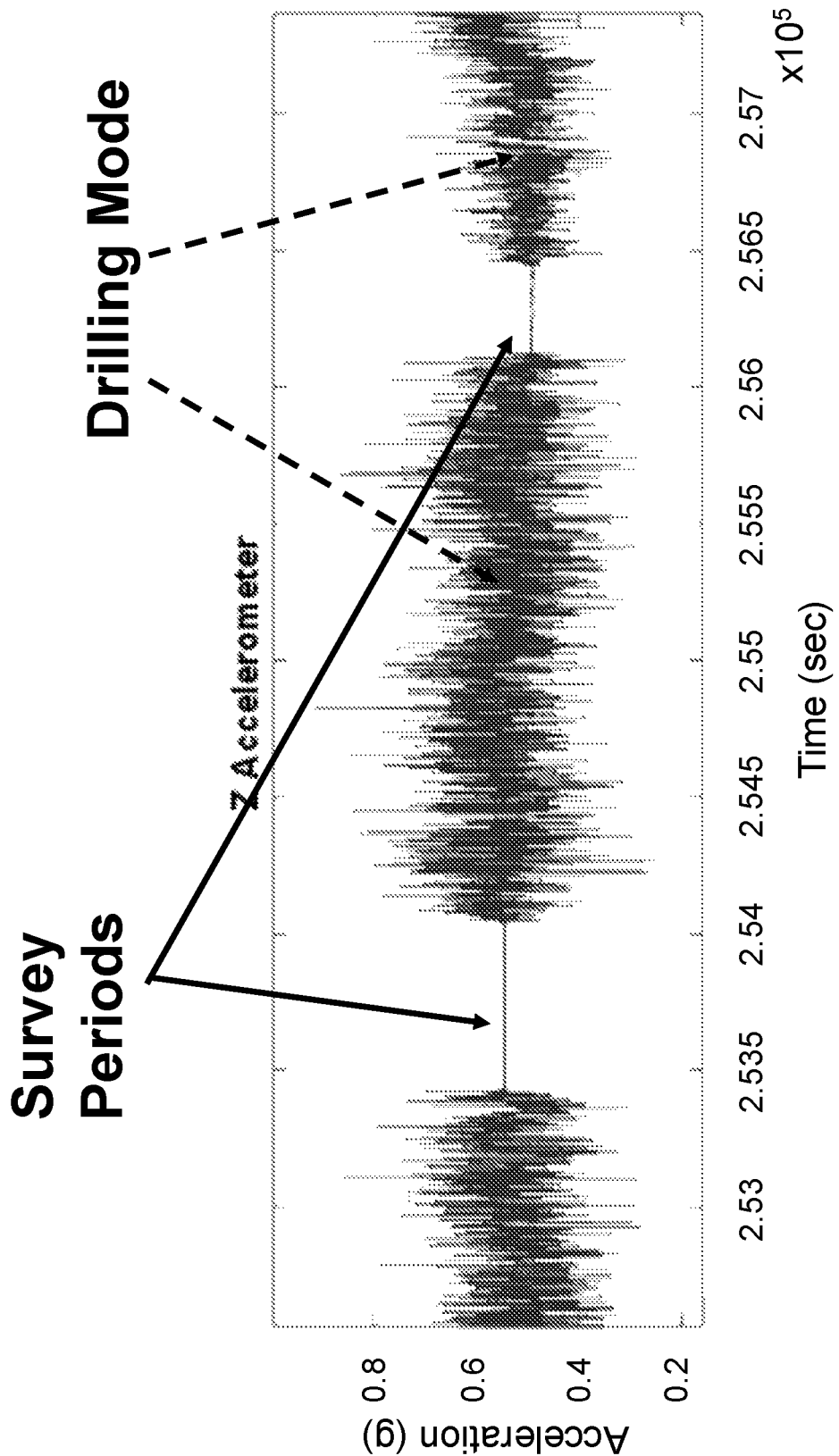
FIG. 3 is an illustration of accelerometer time history showing the difference between noisy drilling periods and quiet survey periods according to some embodiments of the present disclosure.

FIG. 3 depicts accelerometer time history showing the difference between noisy drilling periods (i.e., drilling mode) and quiet survey periods during which accurate measurements of gravity can be made. The sensors used for these measurements, namely accelerometers, gyroscopes, and magnetometers, all exhibit bias and scale factor errors.

Estimates for the bias and scale factor are used to compensate for these errors. For example, if an orthogonally mounted sensor triad with known bias vector b and scale factor matrix S registers a measured value $\tilde{U}$, which could be acceleration, rotation rate, or magnetic field, depending on the sensor, then the corrected measurement $\hat{U}$ is obtained as follows:

$$\hat{U} = S(\tilde{U} - b), \text{ where } b = \begin{bmatrix} b_x \\ b_y \\ b_z \end{bmatrix} \text{ and } S = \begin{bmatrix} S_{xx} & S_{xy} & S_{xz} \\ S_{yx} & S_{yy} & S_{yz} \\ S_{zx} & S_{zy} & S_{zz} \end{bmatrix}. \quad (1)$$

It should be noted that the off diagonal terms of the scale factor matrix S correct any non-orthogonality of the sensor axes. For clarity, generically denote by U the vector consisting of the x, y, and z-components of acceleration, rotation rate, or magnetic field. More specifically, for accelerometers, $$U \to A = (a_x, a_y, a_z)$$

is the acceleration vector. For gyroscopes, $$U \to \omega = (\omega_x, \omega_y, \omega_z)$$

is the rotation rate vector, and for magnetometers, $$U \to M = (m_x, m_y, m_z)$$

is the magnetic field vector. Various sensors, such as Micro Electro Mechanical Sensor (MEMS) gyroscopes, require more complex compensation models which include dependence on the specific force applied to the sensor (e.g., gravity vector). The so-called g-dependence can range from a linear term in the bias, extending Equation (1) above into the form $$\hat{\omega} = S[\tilde{\omega} - (\hat{b} + Gf)]$$

to quadratic terms in both the bias and scale factor, resulting in the compensation model $$\hat{\omega} = (\hat{S} + S_g f + S_2 f^2)[\tilde{\omega} - (\hat{b} + Gf + G_2 f^2)],$$

where f is the specific force vector $f=(f_x, f_y, f_z)$ experienced by the sensor and it is equal to gravity (g) when the sensor is at rest. $S_2$ and $G_2$ are matrices of coefficients multiplying $f^2$ (f squared). $f^2$ is a vector which will have all possible two-term products of the components of f, so that $f^2=[fx^2, fy^2, fz^2, fx*fy, fx*fz, fy*fz]$. In the most general case, $S_2$ and $G_2$ are 3 by 6 matrices of coefficients. Thus, when one multiplies $f^2$ by one of these matrices, $S_2$ (3 by 6)*$f^2$ (6 by 1), one ends up with a 3 by 1 vector, which corresponds to the xyz components of the sensor. G is a f-sensitivity coefficient matrix which when multiplied with the specific force vector gives the value of the additional bias due to the specific force.

In the system according to embodiments of the present disclosure, b and S are updated after each measurement. Normally, these quantities are derived from lab measurements and are assumed to remain constant during operation. However, in reality they often do change over time, deviating from their assumed constant values, thus reducing the accuracy of calibration. The invention described herein estimates how they change over time. In addition, in-field measurements themselves are used (as opposed to laboratory measurements) to estimate b and S.

As described above, laboratory calibration is typically used to get estimates for the bias and scale factor, including their dependence on temperature and specific force (g-force). However, many sensor characteristics can change in the field, including their biases and scale factors. These changes can be attributed to two main effects. First, the downhole drilling environment is very harsh, with sustained high levels of shock and vibration, high temperatures, and temperature gradients, all of which can physically alter or degrade the sensors and modify their responses from their baseline behavior observed in a laboratory environment. Secondly, even in benign environments, bias and scale factors tend to drift unpredictably over time, deviating from laboratory calibration. Thus, in order to maintain survey measurement accuracy, a method is needed to periodically re-calibrate the sensors while they are downhole in the BHA. The system described herein achieves that goal with an algorithm which combines multi-orientation calibration with a weighted sliding window of the most recent measurements, implemented as embedded software on a BHA or any other guidance and navigation unit. Below is a description of the multi-orientation calibration procedure, and how the sliding window concept applied to it permits tracking bias and scale factor drifts.

(2.1) Multi-Orientation Calibration

Figure 4:
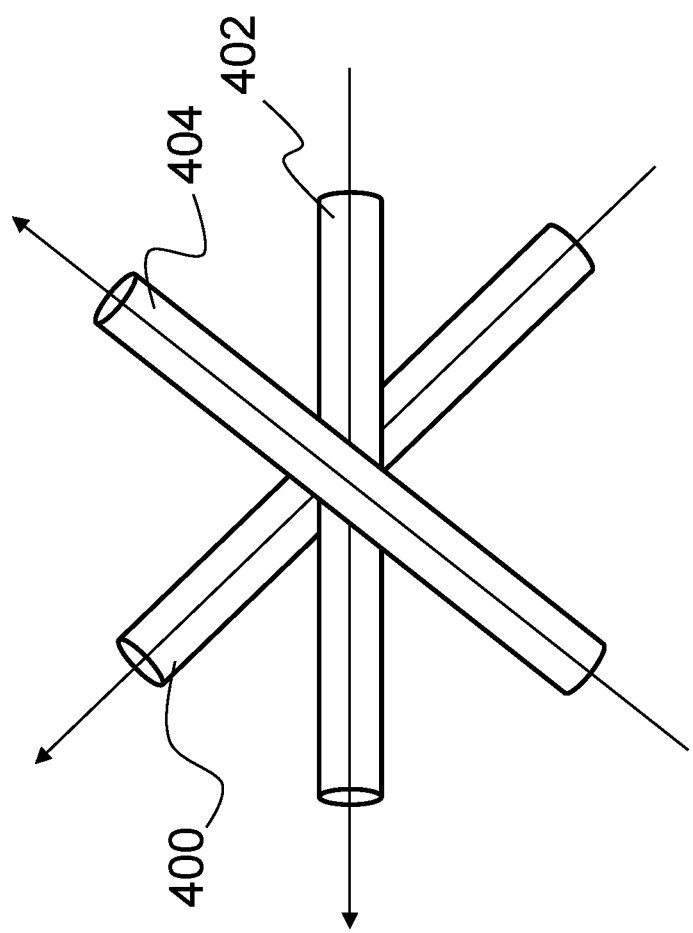
FIG. 4 is an illustration of multiple orientations used to measure quantities according to some embodiments of the present disclosure.

In order to calibrate an orthogonally mounted sensor triad (xyz-components), measurements of a known vector quantity are made with multiple orientations of the triad (represented by elements 400, 402, and 404), as shown in FIG. 4. Then, a bias vector b and a scale factor matrix S are computed such that the norms of all the measurements agree as closely as possible with the norm of the reference vector. For example, when an accelerometer triad is used to measure gravity, the norm (magnitude) of every measurement must satisfy the following:

$$|A| = \sqrt{a_x^2 + a_y^2 + a_z^2} = g,$$

where g is gravity (i.e., the reference quantity), $a_x$, $a_y$, and $a_z$, are the xyz components of the acceleration vector measured by the triad, and |A| is the norm or magnitude of the measured acceleration vector. Different variations of this general approach exist, such as described in detail by Frosio et al. in "Autocalibration of MEMS Accelerometers," IEEE Transactions on Instrumentation and Measurement, 58.6 (2009): 2034-2041, which is hereby incorporated by reference as though fully set forth herein. Two advantages of the prior art approach are that (1) orientations need not be known precisely, so that no errors are introduced from angle measurements, and (2) misalignment errors between the xyz components get accounted for by the off diagonal terms of the scaling factor matrix S. The same calibration procedure can be used with magnetometer and gyroscope triads, where the norms of the measurements are made to agree with reference values, which in the case of wellbore drilling are the Earth's magnetic field and the Earth's rotation, respectively. It should be noted that while gravity and Earth's rotation rate are for practical purposes constant in time and space, the Earth's magnetic field fluctuates both in time and space. Therefore, each measurement has to be constrained to a magnitude that is dependent on the time and location of the measurement. Various services, such as MagVAR (magvar.com), have software which provides an estimate of the Earth's magnetic field based on time and location inputs. In the wellbore drilling industry, accounting for these changes in Earth's magnetic field is referred to as "In-Field Referencing" (IFR).

Described below is the embedded calibration algorithm, using as examples the simplest compensation model given by Equation (1) and the gyroscope as the sensor. Given k measurements of $U_k$, where U can be any of acceleration, rotation rate, or magnetic field, a bias vector b and a scale factor matrix S are sought such that the cumulative error E representing the deviation from the reference norms $|U_{ref}^{(k)}|$ over all measurements is minimized.

$$E = \Sigma_{k=1}^{N}(w_k e_k),$$

where $e_k = |\hat{U}|^2 - |U_{ref}^{(k)}|^2 = |S(\tilde{U}_k - b)|^2 - |U_{ref}^{(k)}|^2$
is the error for each individual ($k^{th}$) measurement based on the noise level observed during said measurement. For accelerometers, the reference norm is for most practical purposes constant for all measurements and equals gravity g:

$$|U_{ref}^{(k)}| = |A_{ref}^{(k)}| = g, \text{ for all measurements } k=1,\ldots,N.$$

For gyroscopes, the reference norm is also considered constant for all measurements and equal the Earth's rotation rate $\Omega_{Ear}$:

$$|U_{ref}^{(k)}| = |\omega_{ref}^{(k)}| = \Omega_{Earth}, \text{ for all measurements } k=1,\ldots,N.$$

Finally, for magnetometers the reference norm $M_{Earth}$ (or magnitude) of the Earth's magnetic field varies sufficiently in time and space that it's variation from one measurement to the other has to be taken account. $M_{Earth}$ has to be specifically estimated for each measurement based on the time t and earth location x of said measurement. Thus, for the $k^{th}$ measurement $$|U_{ref}^{(k)}| = |M(x)_{ref}^{(k)}| = = M_{Earl}(t_k, x_k),$$

where $t_k$ is the time of the $k^{th}$ measurement and $x_k$ is the location of the $k^{th}$ measurement. Minimizing the cumulative norm error E is akin to solving a nonlinear curve fitting problem where the unknown curve parameters are the components of the bias vector and scale factor matrix. If any of the g-dependent terms are included in the sensor model, then the elements of the corresponding coefficient matrices are added to the list of curve fitting parameters. For example, with g-dependent biases, the error term $e_k$ take on the form $e_k = |\hat{S}\{\omega - (\hat{b} + Gf)\}|^2 - |\omega_{ref}|^2$.

In order to solve for the calibration (or fit) parameters, an embedded implementation of the Levenberg-Marquardt optimization algorithm is used to minimize this error and obtain the bias and scale factor values which best compensate measurements so that they come closest to agreeing with the norm of the reference quantity. For example, in the case of gyroscopes used in borehole surveying, $\Omega_{ref} = \omega_{Earth}$ (i.e., the Earth's rotation rate). As can be appreciated by one skilled in the art, the invention is not restricted to implementation of the Levenberg-Marquardt optimization algorithm. Other optimization methods, such as the steepest descent method, can be used, such as those described in C. T. Kelley, Iterative Methods for Optimization, SIAM Frontiers in Applied Mathematics, no 18, 1999, ISBN 0-89871-433-8," which is hereby incorporated by reference as though fully set forth herein.

(2.2) Sliding Window for Adaptive Calibration

The multi-orientation calibration is typically used in a laboratory setting where the environment is controlled so that the bias and scale factor remain constant during measurements and can be determined precisely. With downhole measurements, there is no control over the environment or the time elapsed between measurements. Therefore, the bias and scale factor do drift from one measurement to another. The invention described herein consists of a sliding time window which seeks to track in time the bias and scale factor in order to update them after each measurement and maintain accurate calibration.

Figure 5:
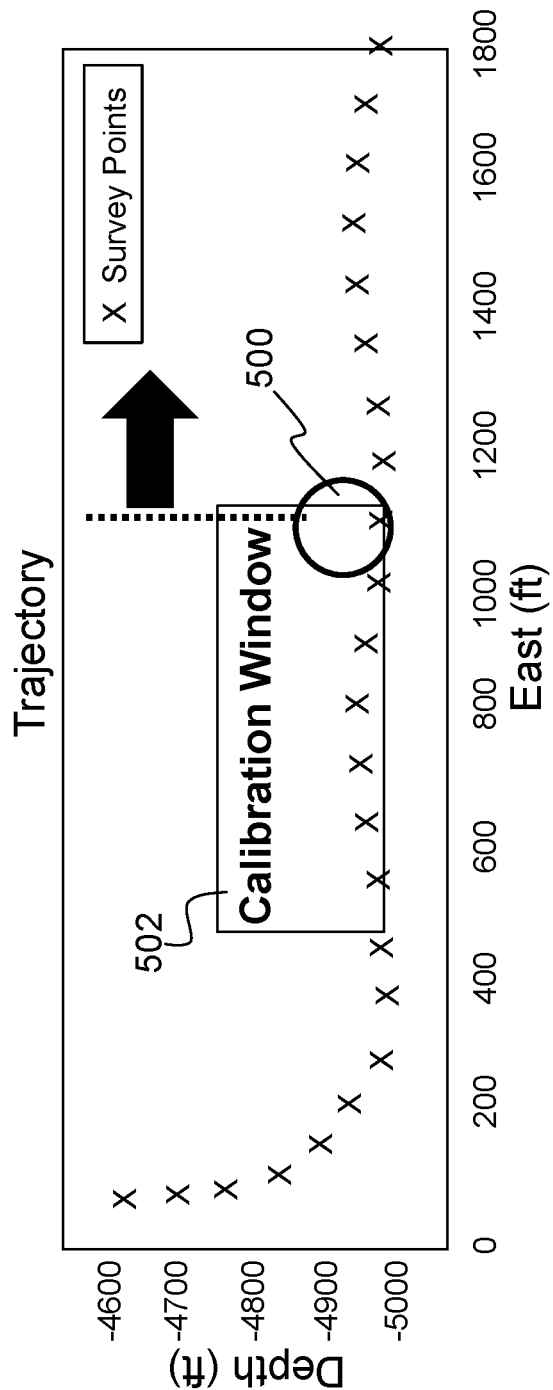
FIG. 5 is an illustration of a wellbore trajectory and calibration according to some embodiments of the present disclosure.

FIG. 5 depicts a wellbore trajectory with survey points of quiet periods marked by x. Calibration of every new survey (represented by the circle 500) is done using a window (i.e., calibration window 502) of most recent measurements. In other words, FIG. 5 shows the survey points for a drilling trajectory with the advancing time window concept according to embodiments of the present disclosure. The measurements for each survey are stored in memory by the embedded software. After each measurement, such as the one circled in FIG. 5 (element 500), the software replaces the oldest measurement in the calibration window 502 with the latest measurement and attempts to re-calibrate the sensors. The software code then assesses the quality and reliability of the calibration by going through a check list that includes, but is not limited to, (1) convergence of the optimization (e.g., Levenberg-Marquardt algorithm; although any suitable algorithm can be used such that it minimizes the cost function E=sum( . . . ) defined above), (2) sufficient angle variation between the orientations of all the measurements in the window (2-3 degrees is usually sufficient) and (3) the Condition Number of the matrices used by the optimization algorithm (i.e., the optimization minimizes the error for a given curve fitting model). The Condition Number of a matrix is a measure of how "ill-conditioned" it is. In a practical sense, it is a measure of how error prone is the solution of a system described by this matrix. If the Condition Number is very high, the numerically computed solutions are likely to suffer large errors and cannot be trusted. Thus, when a large Condition Number is observed, the computed calibration parameters are not trusted. The Condition Number is described in "Belsley, David A.; Kuh, Edwin; Welsch, Roy E. (1980). "The Condition Number". Regression Diagnostics: Identifying Influential Data and Sources of Collinearity. New York: John Wiley & Sons. pp. 100-104. ISBN 0-471-05856-4," which is hereby incorporated by reference as though fully set forth herein.

If the calibration is successful, the bias and scale factor are updated. If it is not, the window of data points is expanded to include older measurements, and calibration is attempted again. This is repeated until either calibration is successful or it is determined that older measurements are not representative anymore of the current state of the sensors, in which case calibration parameters are left unchanged from the previous measurement.

The procedure described above is one embodiment of the invention according to embodiments of this disclosure. Additional embodiments include weighting each measurement such that the most recent one has the greatest effect on calibration, with older measurements getting lower weighting the older they are. Another embodiment is using polynomial expansions for the bias and scale factors to represent their drift, allowing to track them more accurately. For example, to model a linear variation within the calibration window, one can modify the bias vector to be a linear function instead of just a constant within the window of calibration by re-writing it as the following:

$$b = \begin{bmatrix} b_x^0 + \alpha(b_x^1 - b_x^0) \\ b_y^0 + \alpha(b_y^1 - b_y^0) \\ b_z^0 + \alpha(b_z^1 - b_z^0) \end{bmatrix}$$

where the parameter $\alpha$ takes on values between 0 and 1, starting from 0 for the oldest measurement to reach 1 for the most recent measurement. The idea of expressing the bias and scale factors as polynomials and solving for their coefficients using a norm-based optimization is unique and improves upon existing technologies. The elements of the scale factor matrix can be modified in a similar fashion. Even more complexity can be added by using an arbitrary-order polynomial representation of the drift instead of a linear one, so that each component of the bias vector and scaling matrix, generically named c here, can be written as an $N^{th}$ order polynomial as follows:

$$c = \sum_{n=0}^{N} \alpha^n c_n = c_0 + \alpha c_1 + \ldots + \alpha^N c_N.$$

However, while adding more calibration parameters can represent the bias and scale factor drifts more accurately, the calibration window has to be made larger to include at least as many data points as the number of unknown calibration parameters ($c_0, c_1, c_2, \ldots, c_N$) that need to be solved. Note that the idea of expressing the bias and scale factors as polynomials and solving for their coefficients using a norm-based optimization according to the embodiments of the present disclosure is unique and goes beyond existing methods.

(2.3) Experimental Studies

Figure 6B:
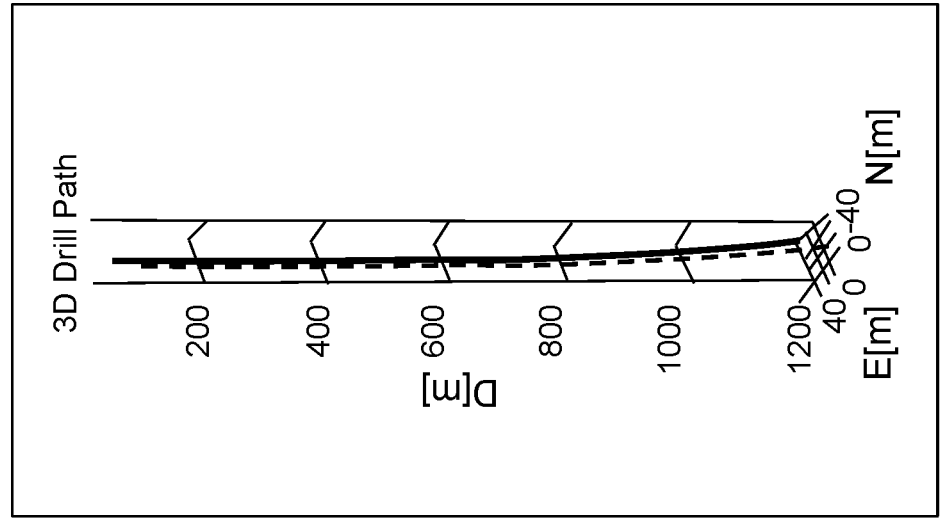
FIG. 6B is an illustration of a reference trajectory compared with a trajectory obtained with downhole calibration correcting bias errors according to some embodiments of the present disclosure.
Figure 6A:
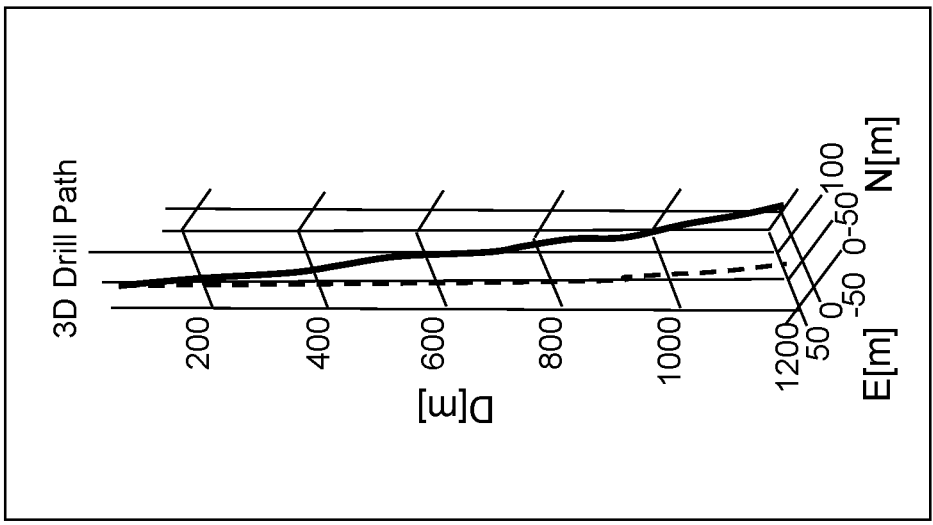
FIG. 6A is an illustration of a reference trajectory compared with a trajectory obtained with bias errors applied to the accelerometer triad according to some embodiments of the present disclosure.

In initial experimental studies of the system according to embodiments of the present disclosure, bias errors were purposely added to the survey measurements of a trajectory, and the trajectory accuracies with and without downhole calibration were compared. FIGS. 6A and 6B illustrate that downhole calibration according to embodiments of the present disclosure dramatically reduces trajectory error growth, demonstrating that the system and process described herein provides a dramatic improvement in the technologies associated with borehole drilling. In both FIG. 6A and FIG. 6B, the dashed line represents a reference trajectory, and the solid line represents AGWD (Autonomous Guidance While Drilling) surveys. FIG. 6A depicts a reference trajectory vs. a trajectory obtained with bias errors applied to the accelerometer triad. FIG. 6B depicts a reference trajectory vs. a trajectory obtained with downhole calibration correcting the bias errors according to embodiments of the present disclosure, resulting in aligned trajectories.

FIG. 6A shows how much the trajectory deviates from the reference when bias errors ($b_x$=0.85 m/s$^2$, $b_y$=0.6 m/s$^2$, $b_z$=−0.75 m/s$^2$ (m denotes meters, and s denotes seconds)) are applied to the accelerometer. With downhole calibration turned on, the trajectory in FIG. 6B is obtained, which deviates from the reference trajectory by at most 1.1 meters vs. 90 meters for the uncalibrated trajectory.

Figure 7A:
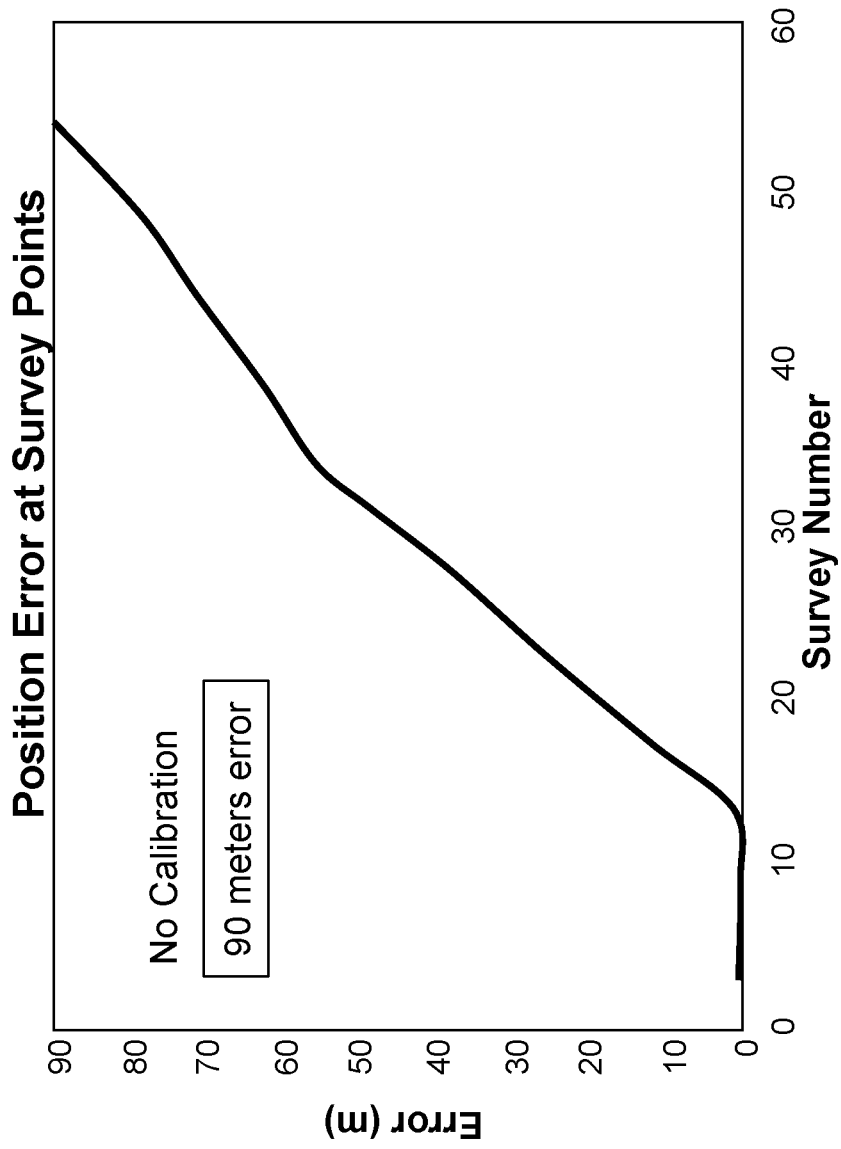
FIG. 7A is an illustration of trajectory error growth with bias errors applied to the accelerometer according to some embodiments of the present disclosure.
Figure 7B:
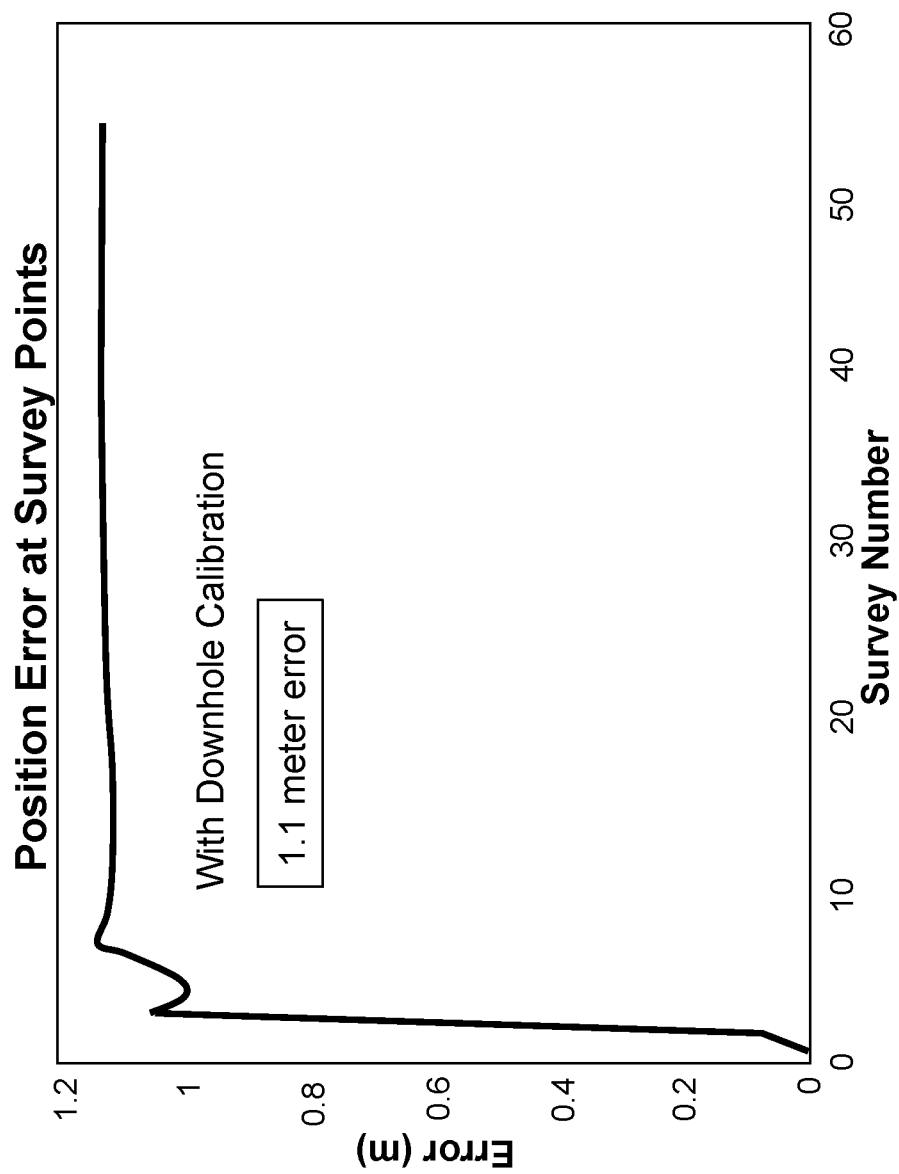
FIG. 7B is an illustration of trajectory error with bias errors corrected by downhole calibration according to some embodiments of the present disclosure.

The error growth from one survey point to the other is shown in FIGS. 7A and 7B, where it is shown that after a few survey points, the downhole calibration algorithm according to embodiments of the present disclosure is able to calibrate the sensors to prevent further error growth. Specifically, downhole calibration reduces error at the end of the trajectory by a factor of almost 90. FIG. 7A shows trajectory error growth with bias errors applied to the accelerometer. FIG. 7B shows trajectory error with bias errors corrected by downhole calibration.

Figure 8:
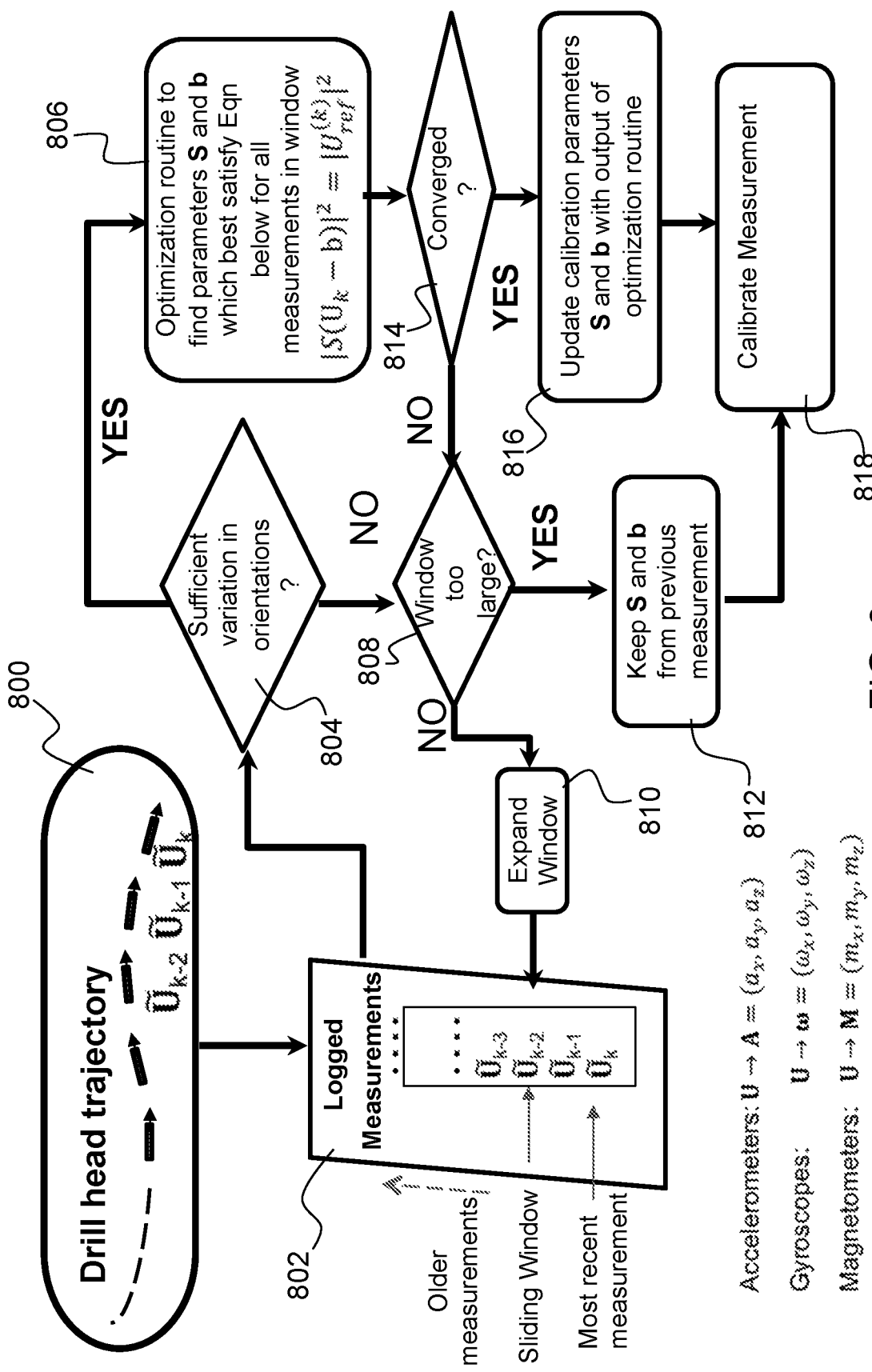
FIG. 8 is a flow diagram illustrating wellbore trajectory calibration according to some embodiments of the present disclosure.
Figure 9:
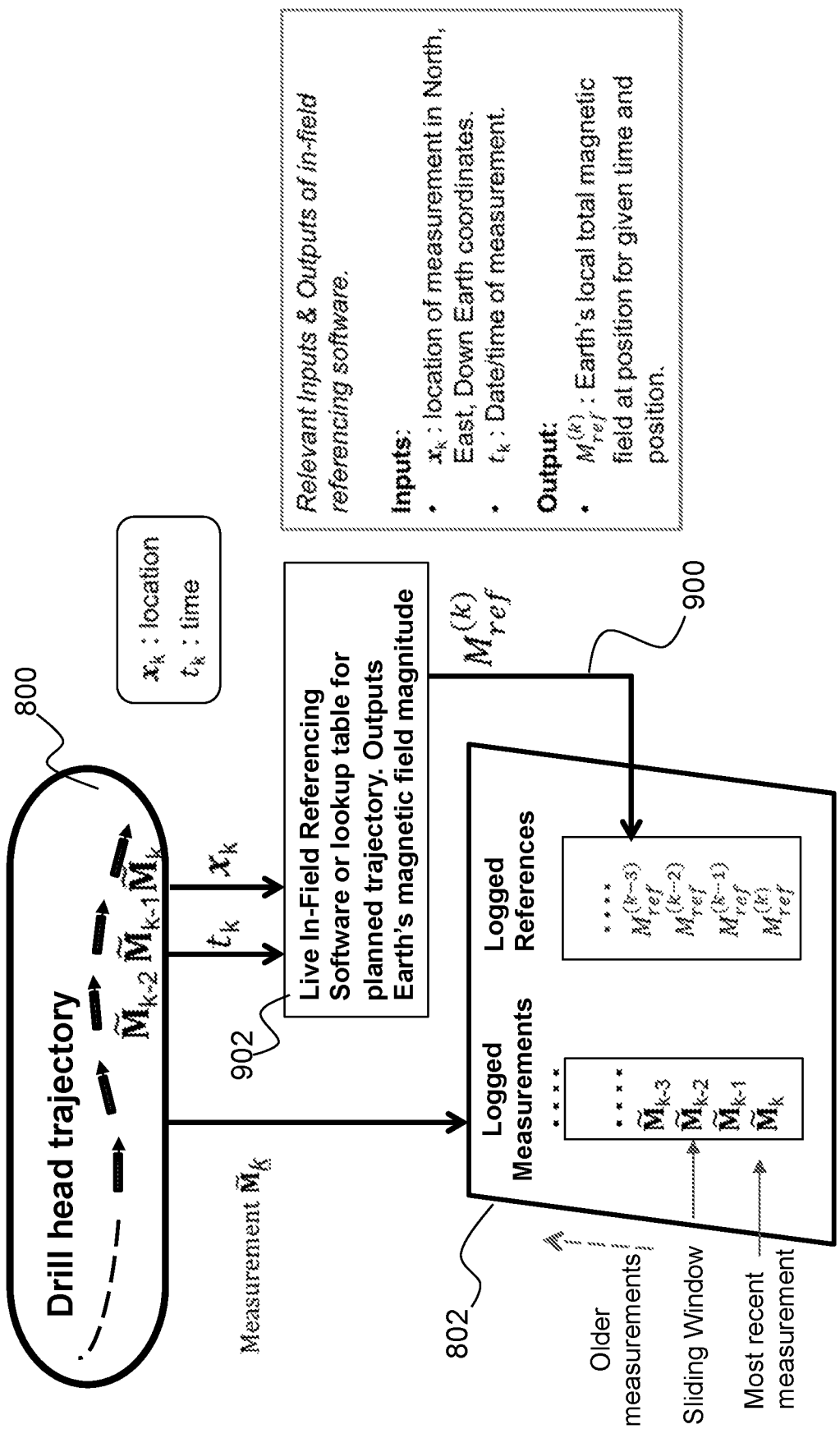
FIG. 9 is an illustration of modification to the survey table according to some embodiments of the present disclosure.
Figure 13:
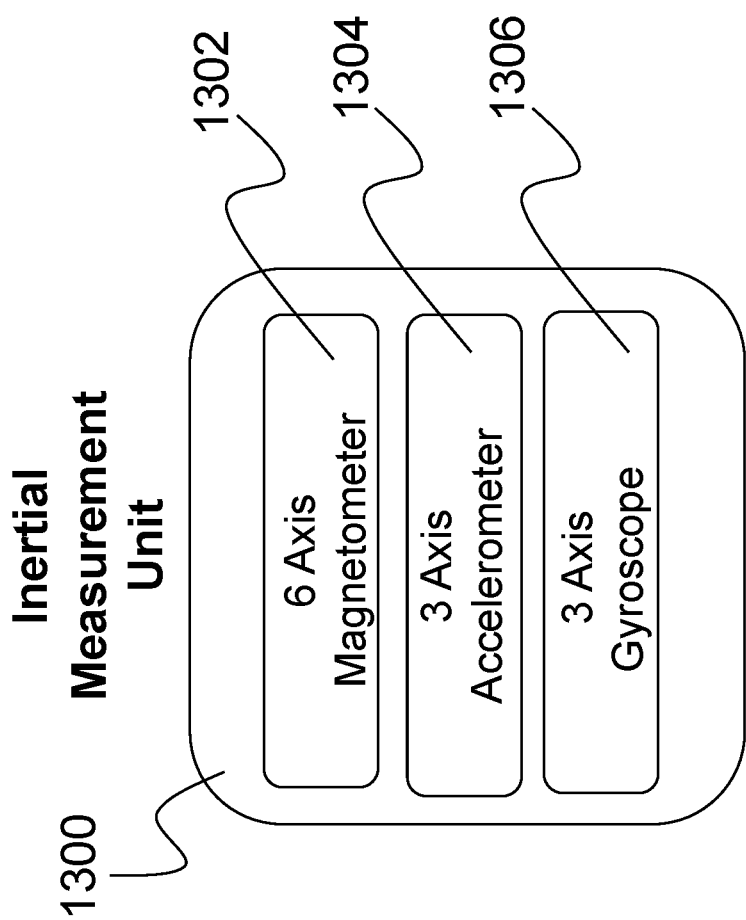
FIG. 13 is an illustration of an inertial measurement unit having multi-axis sensors according to some embodiments of the present disclosure.

FIG. 8 is a flow diagram depicting downhole calibration according to embodiments of the present disclosure. Measurements of a drill head trajectory 800 obtained from multi-axis accelerometers, gyroscopes, and magnetometers of an inertial measurement unit (IMU) are logged in a survey table (element 802). FIG. 13 depicts one embodiment of an IMU (element 1300) having several multi-axis sensors, including a multi-axis magnetometer (element 1302), a multi-axis accelerometer (element 1304), and a multi-axis gyroscope (element 1306). Referring back to FIG. 8, the logged measurements (element 802) include older measurements and recent measurements, and in the case of magnetometers also includes the reference magnitude for each measurement. FIG. 9 depicts modification to the survey table 802 (or chart) consisting of adding the logging magnetic reference (element 900) unique to each survey based on the output of IFR (in-field referencing 902) software. FIG. 9 shows the special case of element 802 for magnetometers, where the reference norm (i.e., the magnetic field magnitude of the Earth) is computed as a function of the time and location of the measurement.

Referring again to FIG. 8, the system then assesses the quality and reliability of the calibration by determining, for example, if there is sufficient angle variation (element 804) between the orientations of all measurements in the calibration window. If the calibration is successful (e.g., there is sufficient angle variation), then the bias (b) and scale factor (S) are updated (element 806). The following are references for the sensors utilized in wellbore drilling. For accelerometers, $|u_{ref}|=g$, and it is typically considered constant. For gyroscopes, $|u_{ref}|=\Omega_{Earth}$ is constant, where $\Omega_{Earth}$ represents the Earth's rotation rate.

Figure 10:
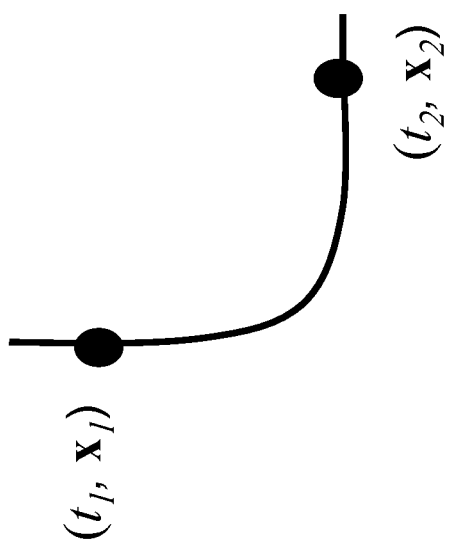
FIG. 10 is an illustration of reference magnetic field norm changes at survey points along a wellbore according to some embodiments of the present disclosure.

For magnetometers, the reference norm for each measurement is different because the Earth's magnetic field is a function of space and time. Therefore, the reference magnetic field for each single measurement must be computed based on the time and location of the measurement. The magnetic reference M must be expressed as a function of time $t_k$ and location $x_k$ of the $k^{th}$ measurement $u_k$ according to $|u_{ref}^{(k)}|=M_{Earth}(t_k, x_k)$. The error expression is then modified simply by adding a superscript k to the reference norm, because it is different for each measurement $u_k$ according to the following: $e_k=|S(\tilde{u}_k-b)|^2-|u_{ref}^{(k)}|^2$. Various commercial and government software provide estimates to the magnetic reference based on measurement databases and physical models, such as magvar.com. FIG. 10 depicts how the reference magnetic field norm changes at survey points along a wellbore.

If the calibration is not successful, then the system determines whether the window of data points is too large (element 808). If it is not, the window of data points is expanded (element 810) to include older measurements, and calibration is attempted again. If the window of data points is too large, then the bias (b) and scale factor (S) from a previous measurement are used (element 812).

Following updating of the bias (b) and scale factor (S) (element 806), a determination is made regarding whether there is convergence of the curve fitting optimization (element 814). If not, the system returns to determining whether the window of data points is too large (element 808). If there is convergence, then the calibration parameters (bias (b) and scale factor (S)) are updated 816 with the output of the optimization routine (element 806). The final calibration measurement is then output (element 818).

For each $k^{th}$ measurement $\tilde{u}_k$ by a three-axis sensor in $|S(\tilde{u}_k-b)|^2-|u_{ref}|^2$ (element 806), the squared norm error $e_k$ is given by a known reference from the measurement norm $e_k=|S(\tilde{u}_k-b)|^2-|u_{ref}|^2$, where u can be any of acceleration, rotation rate, or magnetic field. The total error across all N measurements is minimized by minimizing the sum E of the individual measurement errors $E=e_k$.

Figure 11:
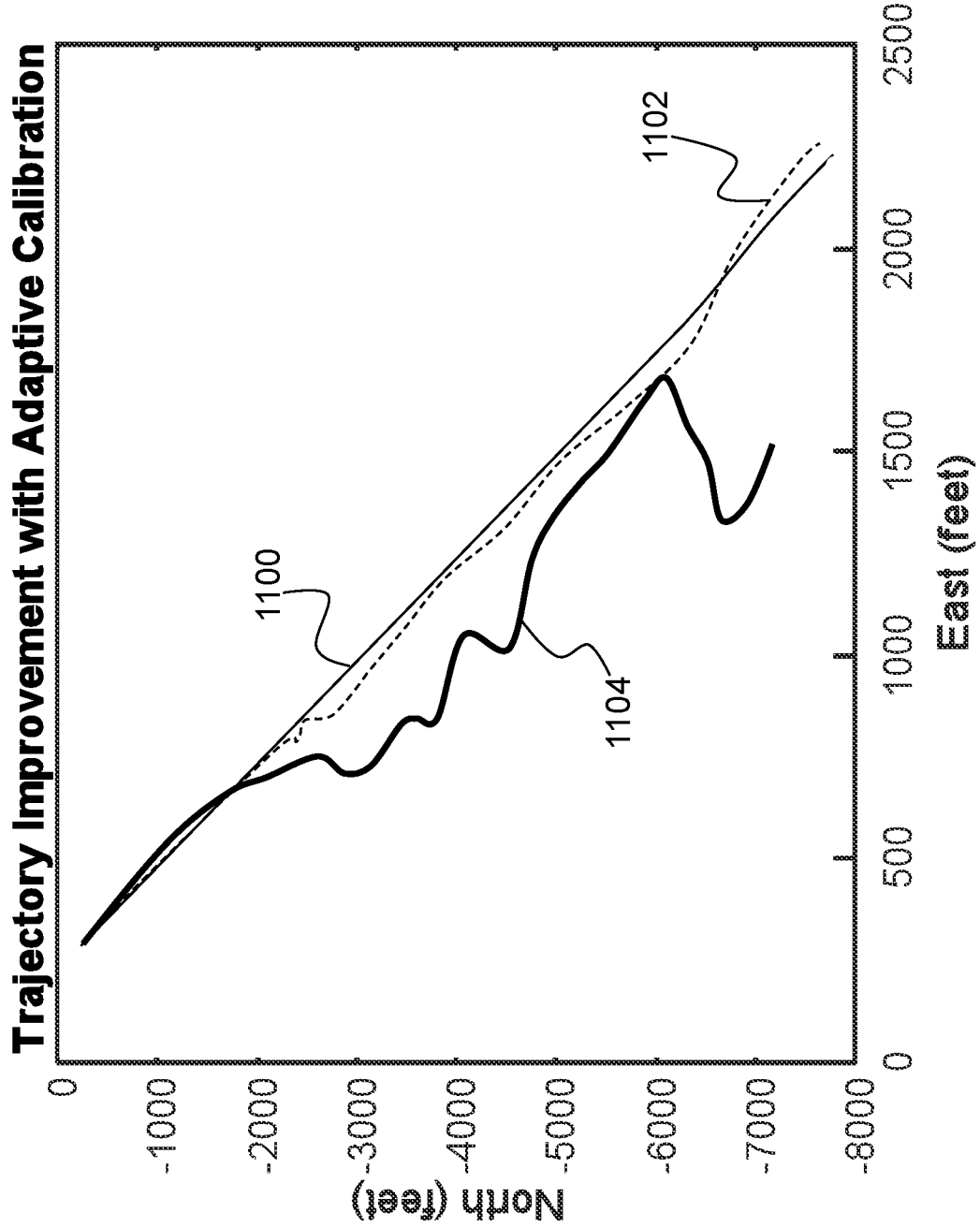
FIG. 11 is an illustration of estimated trajectory deviation as sensor calibration parameters drift over time according to some embodiments of the present disclosure.

FIG. 11 illustrates how the estimated trajectory starts deviating from the reference trajectory of an actual wellbore as sensor calibration parameters drift over time. The adaptive calibration algorithm tracks the drift and compensates for it, resulting in a trajectory estimate that is significantly closer to the known trajectory. In FIG. 11, the solid curve 1100 represents a reference trajectory, the dashed curve 1102 represents an adaptive calibration trajectory (according to embodiments of the invention), and the bold solid curve 1104 represents fixed calibration.

Figure 12:
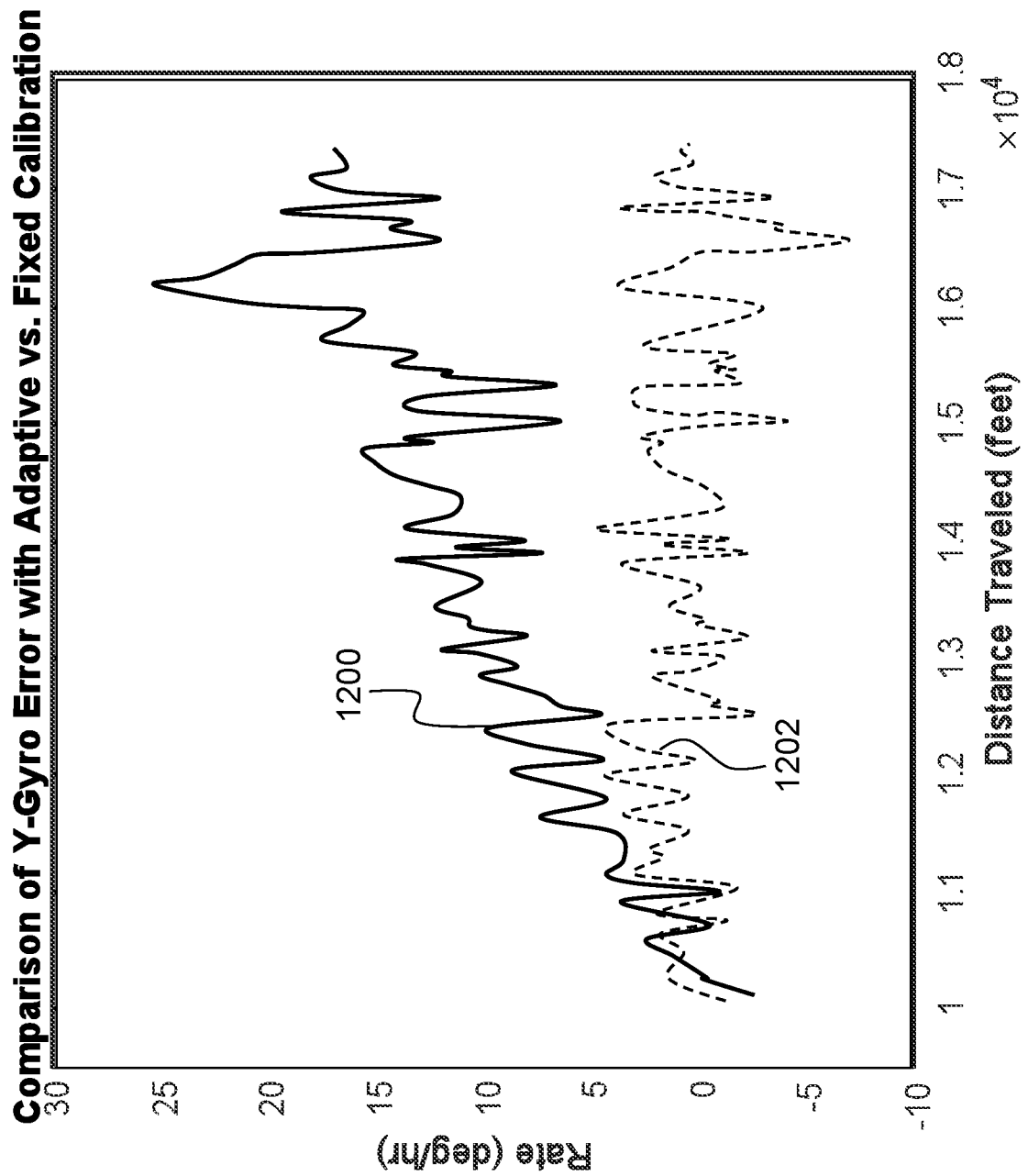
FIG. 12 is an illustration of the effect of drift of calibration parameters on measurement error over time according to some embodiments of the present disclosure.

FIG. 12 depicts how the drift of calibration parameters over time increases the measurement error in one of the gyroscopes onboard a wellbore drilling system. The adaptive calibration algorithm tracks the drift and compensates for it, resulting in significantly lower measurement errors (factor five reduction near the end of the trajectory). In FIG. 12, the solid curve 1200 represents fixed calibration, and the dashed curve 1202 represents adaptive calibration as described herein.

A purpose of the invention described herein is to continuously update and track the calibration parameters of sensors subject to unpredictable drifts caused by harsh environments, random drifts, and general degradation. Furthermore, the algorithms to perform such calibration can be embedded in the autonomous guidance and navigation apparatus of BHAs. The final result is more accurate navigation and wellbore trajectory estimation. Non-limiting examples of automatic actions that can be caused to occur following calibration are (1) correcting/updating measurements with the latest calibration; (2) using updated measurements to compute an updated trajectory; and (3) comparing the updated trajectory to a planned trajectory. Depending on the outcome of the comparison in (3), a human driller can steer the drilling machinery back on course. In an autonomous system, the control system can use the attitude estimated with the new calibration to send commands to its steering system to make the drill head point in the intended direction.

The time evolving nature of the disclosed calibration method, including the functional form of the bias and scale factor components, as well as the measurement weighting scheme of the sliding measurement window, is a technological improvement over the prior art.

As described above, the invention is aimed at improving the performance of inertial measurement units (IMUs) in wellbore drilling BHAs. However, the system can be readily applied to other applications. For example, the calibration of IMUs in vehicles can be updated with new data each time the vehicle comes to a stop. Following calibration, computations can be made to update navigational parameters, such as position and heading (i.e., direction in which the vehicle is pointed). In the case of an autonomous vehicle, which is a GPS-denied environment, it would result in steering inputs to correct for position and heading.

Finally, while this invention has been described in terms of several embodiments, one of ordinary skill in the art will readily recognize that the invention may have other applications in other environments. It should be noted that many embodiments and implementations are possible. Further, the following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means". Further, while particular method steps have been recited in a particular order, the method steps may occur in any desired order and fall within the scope of the present invention.

What is claimed is:

1. A system for adaptive calibration of at least one multi-axis sensor, the system comprising:
    one or more processors and a non-transitory computer-readable medium having executable instructions encoded thereon such that when executed, the one or more processors perform operations of:
        obtaining a sliding time window of previous measurements from the at least one multi-axis sensor having associated bias and scale factor values, wherein the previous measurements comprise measurement errors;
        performing an adaptive calibration of the at least one multi-axis sensor, wherein performing the adaptive calibration comprises:
            determining a reliability of a current calibration of the at least one multi-axis sensor based on an optimization algorithm, wherein the optimization algorithm is used to minimize the measurement errors and obtain bias and scale factor values which best compensate for the measurement errors;
            wherein when the current calibration is determined to be reliable based on convergence of the optimization algorithm, then updating the bias and scale factor values according to an output of the optimization algorithm, resulting in updated bias and scale factor values; and
        calibrating the at least one multi-axis sensor using the updated bias and scale factor values.

2. The system as set forth in claim 1, wherein the one or more processors further perform an operation of using the adaptive calibration for guidance and navigation of a bottom hole assembly (BHA) employed in a wellbore drilling system.

3. The system as set forth in claim 1, wherein the measurement errors comprise bias, scale factor, and non-orthogonality errors.

4. The system as set forth in claim 1, wherein the one or more processors further perform operations of:
    replacing an oldest previous measurement in the sliding time window with a most recent previous measurement, resulting in an updated sliding time window; and
    performing a new adaptive calibration using the updated sliding time window.

5. The system as set forth in claim 1, wherein the one or more processors further perform an operation of determining a bias vector and a scale factor matrix such that a cumulative error representing a deviation from reference values over all of the previous measurements is minimized.

6. The system as set forth in claim 1, wherein when the current calibration is determined to not be reliable, then the one or more processors further perform an operation of expanding the sliding time window to include more previous measurements.

7. The system as set forth in claim 1, wherein each measurement in the sliding time window is weighted such that a most recent previous measurement has the greatest effect on calibration, and wherein previous measurements that are older than the most recent previous measurement are assigned lower weights.

8. The system as set forth in claim 1, wherein polynomial expansions are used to represent drifts of the bias and scale factor values over time.

9. The system as set forth in claim 1, wherein the sliding time window of previous measurements and the current measurement are used to compute estimates of a wellbore path.

10. A computer implemented method for adaptive calibration of at least one multi-axis sensor, the method comprising an act of:
    causing one or more processors to execute instructions encoded on a non-transitory computer-readable medium, such that upon execution, the one or more processors perform operations of:
        obtaining a sliding time window of previous measurements from the at least one multi-axis sensor having associated bias and scale factor values, wherein the previous measurements comprise measurement errors;
        performing an adaptive calibration of the at least one multi-axis sensor, wherein performing the adaptive calibration comprises:
            determining a reliability of a current calibration of the at least one multi-axis sensor based on an optimization algorithm, wherein the optimization algorithm is used to minimize the measurement errors and obtain bias and scale factor values which best compensate for the measurement errors;
            wherein when the current calibration is determined to be reliable based on convergence of the optimization algorithm, then updating the bias and scale factor values according to an output of the optimization algorithm, resulting in updated bias and scale factor values; and
        calibrating the at least one multi-axis sensor using the updated bias and scale factor values.

11. The method as set forth in claim 10, wherein the measurement errors comprise bias, scale factor, and non-orthogonality errors.

12. The method as set forth in claim 10, wherein the one or more processors further perform operations of:
    replacing an oldest previous measurement in the sliding time window with a most recent previous measurement, resulting in an updated sliding time window; and
    performing a new adaptive calibration using the updated sliding time window.

13. The method as set forth in claim 10, wherein the one or more processors further perform an operation of determining a bias vector and a scale factor matrix such that a cumulative error representing a deviation from reference values over all of the previous measurements is minimized.

14. The method as set forth in claim 10, wherein when the current calibration is determined to not be reliable, then the one or more processors further perform an operation of expanding the sliding time window to include more previous measurements.

15. The method as set forth in claim 10, wherein each measurement in the sliding time window is weighted such that a most recent previous measurement has the greatest effect on calibration, and wherein previous measurements that are older than the most recent previous measurement are assigned lower weights.

16. The method as set forth in claim 10, wherein polynomial expansions are used to represent drifts of the bias and scale factor values over time.

17. A computer program product for adaptive calibration of at least one multi-axis sensor, the computer program product comprising:
  computer-readable instructions stored on a non-transitory computer-readable medium that are executable by a computer having one or more processors for causing the processor to perform operations of:
    obtaining a sliding time window of previous measurements from the at least one multi-axis sensor having associated bias and scale factor values, wherein the previous measurements comprise measurement errors;
    performing an adaptive calibration of the at least one multi-axis sensor, wherein performing the adaptive calibration comprises:
      determining a reliability of a current calibration of the at least one multi-axis sensor based on an optimization algorithm, wherein the optimization algorithm is used to minimize the measurement errors and obtain bias and scale factor values which best compensate for the measurement errors;
      wherein when the current calibration is determined to be reliable based on convergence of the optimization algorithm, then updating the bias and scale factor values according to an output of the optimization algorithm, resulting in updated bias and scale factor values; and
    calibrating the at least one multi-axis sensor using the updated bias and scale factor values.

18. The computer program product as set forth in claim 17, further comprising instructions for causing the one or more processors to further perform an operation of determining a bias vector and a scale factor matrix such that a cumulative error representing a deviation from reference values over all of the previous measurements is minimized.

19. The computer program product as set forth in claim 17, wherein when the current calibration is determined to not be reliable, then the one or more processors further perform an operation of expanding the sliding time window to include more previous measurements.

20. The computer program product as set forth in claim 17, wherein each measurement in the sliding time window is weighted such that a most recent previous measurement has the greatest effect on calibration, and wherein previous measurements that are older than the most recent previous measurement are assigned lower weights.

* * * * *